United States Patent [19]

Luich

[11] Patent Number: 4,763,027

[45] Date of Patent: Aug. 9, 1988

[54] DEGLITCHING NETWORK FOR DIGITAL LOGIC CIRCUITS

[75] Inventor: Thomas M. Luich, Federal Way, Wash.

[73] Assignee: National Semiconductor Corporation, Santa Clara, Calif.

[21] Appl. No.: 731,811

[22] Filed: May 7, 1985

[51] Int. Cl.⁴ .......................... H03K 3/01; H03K 3/26
[52] U.S. Cl. .................................... 307/546; 307/443; 307/270; 307/555; 307/552; 307/297
[58] Field of Search .............. 307/443, 552, 553, 554, 307/296 R, 297, 270, 200 A, 546, 555

[56] References Cited

U.S. PATENT DOCUMENTS

| | | | |
|---|---|---|---|
| 3,521,141 | 7/1970 | Walton | 307/581 |
| 4,237,414 | 12/1980 | Stein | 323/4 |
| 4,242,605 | 12/1980 | Seelbach | 307/270 |
| 4,620,115 | 10/1986 | Lee et al. | 307/443 |

Primary Examiner—Stanley D. Miller
Assistant Examiner—Richard Roseen
Attorney, Agent, or Firm—Lee Patch; Robert C. Colwell

[57] ABSTRACT

A deglitching network for digital logic circuits includes a voltage actuated current source coupled to a linear tracking, constant voltage column clamp circuit. The deglitching network threshold level tracks closely with the predetermined voltage of the column clamp, which also acts as a current sink. When heavy current loads are switched from the column clamp and its voltage falls briefly, the deglitching network is actuated to inject current into the column clamp circuit and restore the preset voltage.

11 Claims, 3 Drawing Sheets

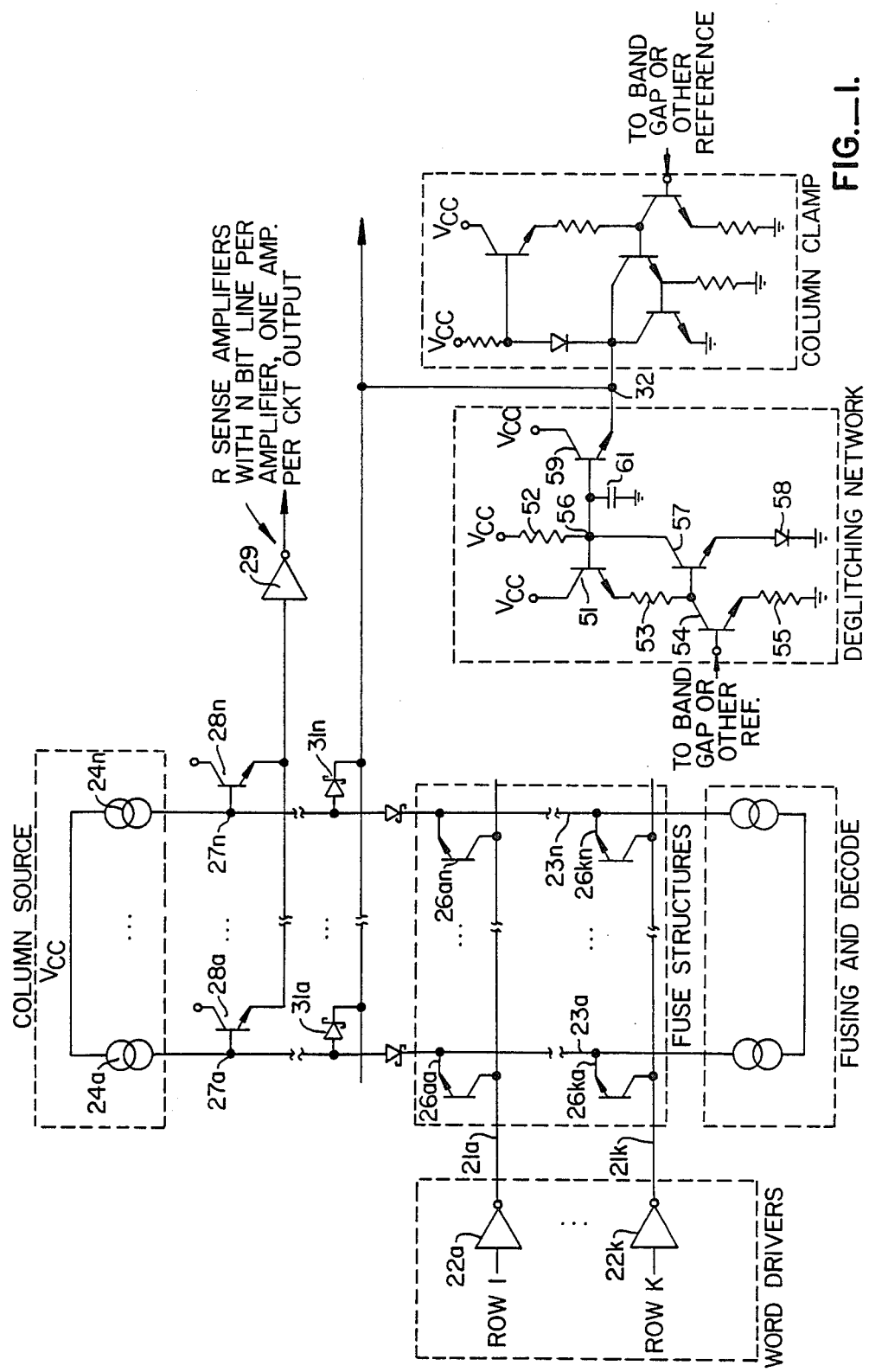
FIG._1.

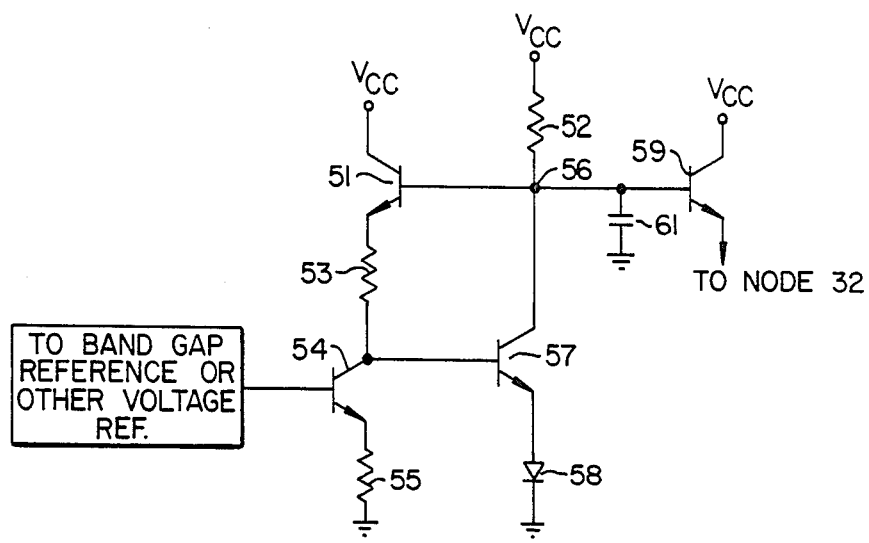
FIG._4.
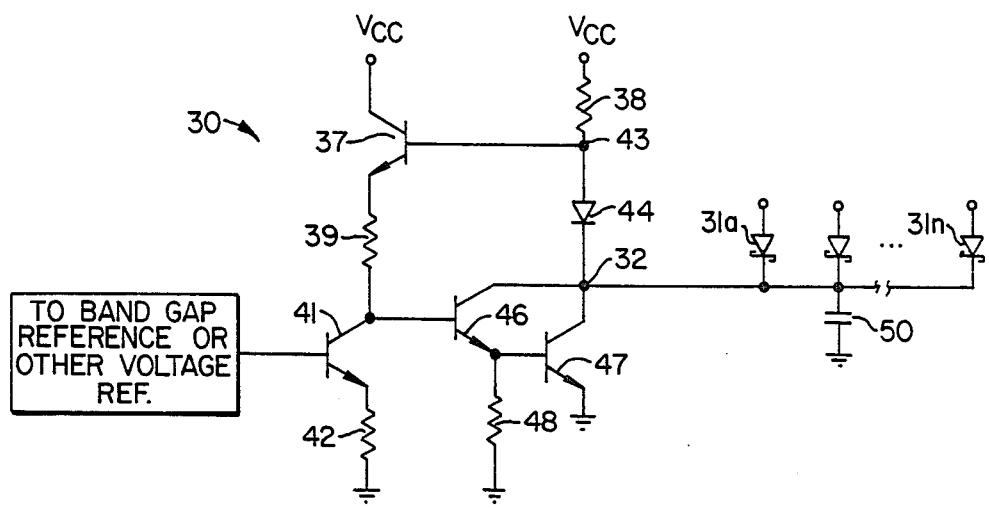
FIG._2. (PRIOR ART)

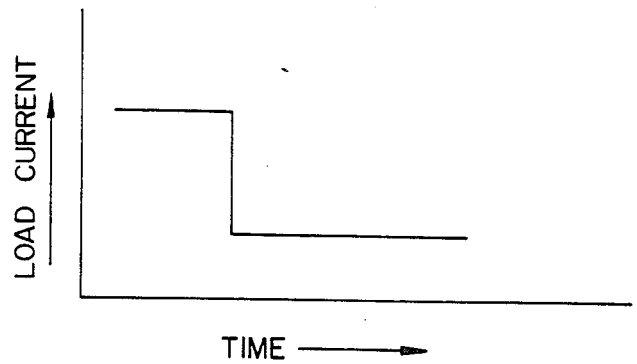
FIG._3a.
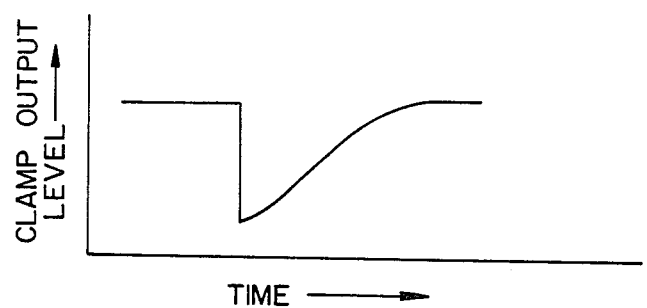
FIG._3b.
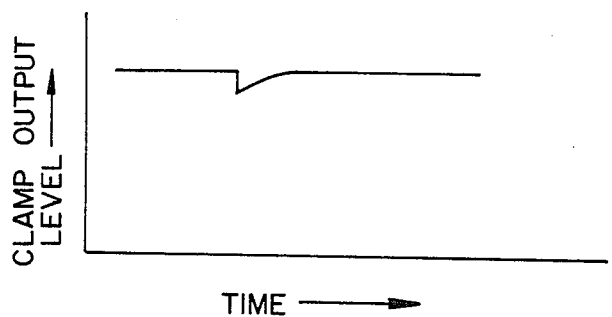
FIG._3c.

DEGLITCHING NETWORK FOR DIGITAL LOGIC CIRCUITS

BACKGROUND OF THE INVENTION

1. Field of the Invention

This invention relates to electronic circuits and particularly to a low level clamping circuit for stabilizing current flow through a circuit node connected to a high level voltage clamping network. The invention is particularly applicable to programmable logic arrays.

2. Description of the Prior Art

In a digital logic network such as a programmable logic array, a plurality of word lines are connected to a plurality of bit lines through logic gates. The product terms of the logic gates are delivered to the bit lines, which are connected by OR gates to sense amplifiers. Because all the output sense nodes are virtually independent of each other, significant variations in their output voltage levels may occur in ordinary operation.

To eliminate unwanted swings in the levels of the bit lines, it is a common design practice to provide a linear tracking, constant voltage column clamp which is diode connected to all the bit lines. The column clamp establishes a generally constant high level voltage for the sense nodes, and prevents radical excursions of the sense node voltages. Therefore, the sense amplifiers are provided with a constant high level reference voltage basis for reducing the digital signal swings of the product terms.

The state-of-the-art column clamp circuit, however, introduces into the logic array its own inherent deficiencies and limitations. For example, in a large programmable logic array, there may be 64 product terms, each presented at an individual sense node. The product terms are mutually independent so that any one or all of the bit lines may be on at a given time. When most or all of the bit lines are off, a large current load is sunk to ground through the column clamp. Conversely, actuation of many or all of the bit lines will shunt the current load to ground through the word lines, and the column clamp will experience a sudden load drop. This load drop, which is a function of the programming of the logic device, will cause the voltage of the sense nodes to drop briefly but precipitously. The column clamp circuit is intended to prevent such fluctuations, but in reality its response is undesirably slow in responding to large load shifts.

During large load changes, the diode connections of the sense nodes to the column clamp act to defeat the intended purpose of the column clamp. That is, the 64 diodes each exert an intrinsic capacitance, and the aggregate of these capacitances creates a significant RC network connected to the reference node of the column clamp. The column clamp may require two or three nanoseconds to overcome the resulting RC rise time effect, which in a system having a 10 nanosecond access time, is, of course, quite significant. While the column clamp voltage is rising to return to its preset value, the sense node high level reference node voltage drop indicative of a logic level shift may fall below the noise margin of the sense amplifiers, causing the sense amplifiers to switch prematurely, or to read incorrect bit line conditions. This condition causes a glitch in which the system fails to operate. Thus, to minimize access time and increase the speed of the logic device, it is desirable to prevent such voltage excursions in the column clamp network.

SUMMARY OF THE INVENTION

The present invention provides a deglitching network for digital logic circuits to prevent voltage excursions in the column clamp network or similar circuits. In a preferred embodiment, the deglitching network comprises a voltage actuated current source coupled to a constant voltage column clamp circuit. The deglitching network threshold level tracks closely with the predetermined voltage of the reference node of the column clamp, which also acts as a current sink. When heavy current loads are switched from the column clamp and the voltage level of the high level reference node falls briefly, the deglitching network is actuated to inject current into the column clamp circuit and restore the preset voltage.

The deglitching network includes a pair of transistors connected between $V_{cc}$ and the voltage reference node of the column clamp. One of the transistors is connected in a voltage divided feedback loop which establishes a reference voltage level slightly below the level set by the column clamp. When the column clamped node voltage falls, the other transistor is switched on to form a low impedance path to $V_{cc}$ and deliver a large amount of current to the clamped node. The voltage divider feedback loop is similar to that of the column clamp, so that both networks track closely over temperature variations. The typical column clamp is designed to act as a sink for large amounts of current, whereas the deglitching network of the present invention is adapted to provide a virtually instantaneous source of large amounts of current. The current injected by the deglitching network is sufficient to overcome the parasitic RC rise time effects in a programmable logic array or the like in which diodes connect the voltage reference node to a large plurality of bit lines.

BRIEF DESCRIPTION OF THE DRAWINGS

FIG. 1 is a schematic drawing of the deglitching network shown in exemplary use in a typical programmable logic array network;

FIG. 2 is a schematic representation of a prior art linear tracking clamp circuit with which the present invention may be employed;

FIGS. 3a–3c are graphic representations of the load and output variations of the linear tracking clamp circuit of FIG. 2, operated with and without the deglitching network of the present invention; and FIG. 4 is a schematic drawing of the preferred embodiment of the deglitching network of the present invention.

DETAILED DESCRIPTION OF THE PREFERRED EMBODIMENT

A preferred embodiment of the present invention generally comprises a deglitching network adapted to stabilize a high level voltage clamped reference node in a logic circuit or the like. In the description of the preferred embodiment the deglitching network will be described with reference to its use in a programmable logic array. Of course, the deglitching network may be employed in any voltage-clamped node arrangement in which the node undergoes large and sudden drops in current load conditions.

With reference to FIG. 1, a typical programmable logic array (PLA) includes a plurality of word lines 21a–21k, each connected to a respective word line driver 22a–22k. The array also includes a plurality of bit lines 23a–23n, each connected to the operating voltage $V_{cc}$ through a respective controlled voltage source 24a–24n. Each of the intersections of the word lines 21 and the bit lines 23 is connected by one or an array of transistors 26aa–26an, 26ka–26kn. The transistors 26 comprise functional logic gates connecting each bit line to all the word lines. Thus, the logic levels of the bit lines comprise the product terms of the word lines, as is known in the prior art.

Each bit line 23 includes a bit sense node 27a–27n. One of a plurality of sense amplifiers 29a–29l is connected to all the sense nodes 27 through OR gates 28a–28n, respectively. To prevent large variations in the relative signal levels of the bit lines, and to establish a common high level reference voltage for the sense amplifiers 29, the sense nodes are clamped to a predetermined high level reference voltage. This is accomplished by connecting the bit lines 23a–23n through diodes 31a–31n, respectively, to a voltage reference node 32. Also connected to the node 32 is a linear tracking, constant voltage column clamp network 30.

FIG. 2 is a schematic diagram of a typical column clamp network 30 known in the prior art. A transistor 37 has its base connected through resistor 38 to $V_{cc}$, and the collector is also connected to $V_{cc}$. The emitter of transistor 37 is coupled through a resistor 39 to the collector of transistor 41. The base of transistor 41 is connected to a fixed bandgap reference voltage (e.g., 1.3 v), and the emitter is connected through resistor 42 to ground. The bandgap reference voltage is translated through the base-emitter drop of transistor 41, establishing a current through resistor 42 to ground. This current is mirrored by the collector of transistor 41 to create a voltage across resistor 39. The voltage drop across resistor 39 is applied across the base-emitter junction of transistor 37, establishing a reference voltage at node 43. Node 43 is connected through diode 44 to the array reference node 32. Transistors 46 and 47 are connected between the collector of transistor 41 and node 32 and ground in a high level driver configuration to provide a current sinking path directly to ground. The voltage drop across diode 44 sets the clamp voltage level at node 32 at $2V_{be}$ plus the voltage drop across resistor 39.

It is desirable to maintain the clamp level constant, because any change in output may surpass the noise level margin of the bit sense nodes 27. A negative feedback loop comprising transistor 37, diode 44, and resistor 39 maintains the voltage level by reducing base drive to transistor 37 when the output falls below the predetermined value, and increasing the base drive at elevated voltages.

The reference node 32 is also connected to all of the diodes 31a–31n. Each of these diodes has an intrinsic capacitance, and their sum comprises a substantial capacitance, represented schematically by capacitor 50 connected to the node 32. A large current drop, for example, as shown in FIG. 3a, may occur at node 32 if an appropriate AC data pattern is fused into the array such that many or all of the product terms are sunk by a single word driver at the same time. At the instant the large load switches out, the high level clamp driver composed of transistors 46 and 47 will momentarily continue to draw a large collector load, although the word driver is now sinking this current. As a result, a negative voltage spike will occur at node 32.

The duration of the negative voltage spike is determined by the RC rise time of the node 32, which in turn is established by the resistor 38 and the large parasitic capacitance 50. The resulting RC rise time is depicted in FIG. 3b. A substantial portion of that rise time represents a period in which the sense amplifiers cannot acquire a single or low number of rising bit line signals, and thus limits the operating speed of the logic array.

The deglitching network of the present invention, shown in FIGS. 1 and 4, reduces the magnitude and duration of the negative voltage spike to tolerable levels. The deglitching network is connected in parallel with the column clamp, and is designed to provide a transient current spike into reference node 32 when the voltage level of node 32 drops below a predetermined noise margin.

As shown in FIGS. 1 and 4, a transistor 51 has its base connected through resistor 52 to $V_{cc}$, and its collector also connected to $V_{cc}$. The emitter of transistor 51 is coupled through a resistor 53 to the collector of transistor 54. The base of transistor 54 is connected to a fixed bandgap reference voltage (e.g., 1.3 v), or similar voltage reference and the emitter is connected through resistor 55 to ground. The bandgap reference voltage is translated through the base-emitter drop of transistor 54, establishing a current through resistor 55 to ground. This current is mirrored by the collector of transistor 54, establishing a voltage across resistor 53. The voltage drop across resistor 53 is applied across the base-emitter junction of transistor 51, establishing a reference voltage at node 56 equal to $3V_{be}$ plus the voltage drop across resistor 53. A feedback loop similar to the feedback loop described in the column clamp network varies the base drive to transistor 51 to maintain a constant voltage at node 56.

The deglitching network also includes a transistor 59 having a collector connected directly to $V_{cc}$, and the emitter connected directly to reference node 32. The base of transistor 59 is connected through capacitor 61 to ground, and also to node 56. Transistor 59, when actuated, forms a low impedance path directly from $V_{cc}$ to the reference node 32, so that a large amount of current may be delivered to the reference node 32 when that node voltage falls suddenly, as described above. Capacitor 61 is provided for added base drive should the transistor 59 be required to deliver an extraordinary amount of current without consuming DC power.

The circuit configuration of the deglitching network is intentionally similar to that of the column clamp so both networks will track closely over the operating temperature range. The deglitching circuit, however, includes a transistor 57 having the collector connected to node 56 and the emitter coupled through diode 58 to ground. The base of transistor 57 is connected directly to the collector of transistor 55. In one embodiment, the component values are chosen so that the node 56 of the deglitching network is maintained, for example, 120 mv lower than the voltage at node 43 of the column clamp network. In this configuration transistor 59 requires greater than 120 mv forward bias to switch on and conduct. Therefore, in this example any negative excursion of node 32 with respect to node 56 exceeding −120 mv will forward bias and actuate transistor 59 and initiate a low level clamping action approximately equal to the high level clamp voltage. Once the negative excursion goes above the exemplary minus (−)120 mv level, transistor 59 is reverse biased to turn off, and no further low level clamping action will occur. The overall result, depicted in FIG. 3c, is that the magnitude and rise time of the negative excursion is substantially reduced or even eliminated, and the access time of the logic array is likewise reduced.

The deglitching network of the present invention has been described in use specifically to stabilize the bit sense nodes of a logic array in conjunction with a column voltage clamp network. The deglitching network may be viewed as a low level clamping network connected in parallel with a high level clamping network and adapted to correct the inherent tracking error of the high level clamping network under severe load shifting conditions. In one example, the high level voltage clamping network may be required to sink 40 milliamps at maximum load conditions, yet the load may drop to 400 microamps within an extremely brief period, in the nanosecond range. It is only in this circumstance that the deglitching network is actuated to inject current into the voltage reference node, and only until the high level driver transistors restabilize the voltage. The deglitching network may be applied to any voltage clamped node situation in which large load variations cause large voltage fluctuations of the clamped node.

The foregoing description is intended to explain the operation and application of a preferred embodiment of the deglitching circuit of this invention. The scope of the invention may be ascertained by reference to the appended claims.

I claim:

1. A deglitching network for stabilizing the current flow thrugh a circuit node intended to be maintained at a predetermined high level reference voltage, comprising:
   means for establishing a deglitching network reference voltage at a first node;
   first transistor means including an emitter-collector circuit connected between a current source and the circuit node, and having a base connected to the first node;
   the deglitching network reference voltage being sufficient to reverse bias the emiter-collector circuit by a predetermined voltage when the circuit node is at the predetermined high level reference voltage; and
   the first transistor means being forward-biased during excursions of a circuit node voltage below the predetermined voltage to form a low impedance path from the current source direcly to the circuit node.

2. The deglitching network of claim 1, wherein said means for establishing a deglitching network reference voltage comprises second and third transistor means connected in a feedback loop to the first node.

3. The deglitching network of claim 2, wherein the second transistor means comprises an emitter-collector junction connected between the current source and a fixed voltage drop means, and a base connected to the first node.

4. The deglitching network of claim 3, wherein the third transistor means defines a feedback path from an emitter of the second transistor means to the first node.

5. The deglitching network of claim 3, further comprising voltage-dropping resistor connected between the current source and the first node.

6. A low level clamping network for stabilizing current flow through a circuit node connected to a high level volage clamping network and intended to be maintained at a predetermined reference voltage, comprising:
   means for establishing a first reference voltage at a first node;
   first transistor means including an emitter-collector circuit connected between a current source and the clrcuit node, and a base connected to the first node;
   the first reference voltage being sufficient to reverse bias the emitter-collector circuit by a predetermined voltage when the circuit node is at the predetermined reference voltage; and
   the first transistor means being forward-biased during excursions of a circuit node voltage below the predetermined voltage to form a low impedance path from the current source directly to the circuit node.

7. The low level clamping network of claim 6, wherein the means for establishing a first reference voltage comprises second and third transistor means connected in a feedback loop to the first node.

8. A low-level clamping circuit for stabilizing a circuit node comprising:
   a first transistor having a base connected to a reference voltage, an emitter coupled to ground and a collector connected to a first node;
   a second transistor having a base connected to the first node, a collector connected to a second node, and an emitter coupled to ground through a diode;
   a third transistor having a collector connected to a potential source, a base connected to the second node and an emitter coupled to the first node; and
   a fourth transistor having a base connected to the second node, an emitter connected to the circuit node and a collector connected to the potential source, the second node also being coupled to the potential source.

9. A circuit as in claim 8 further comprising a capacitor connected between the second node and ground.

10. The low level clamping network of claim 7, wherein the second transistor means comprises an emitter collector junction connected between the current source and a fixed voltage drop means, and a base connected to the first node.

11. The low level clamping network of claim 10, wherein the third transistor means defines a feedback path from an emitter of the second transistor means to the first node.

* * * * *